United States Patent
Schulze et al.

(12) 
(10) Patent No.: US 9,093,568 B1
(45) Date of Patent: Jul. 28, 2015

(54) SEMICONDUCTOR DIODE

(71) Applicant: Infineon Technologies AG

(72) Inventors: Hans-Joachim Schulze, Taufkirchen (DE); Johannes Georg Laven, Taufkirchen (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/253,920

(22) Filed: Apr. 16, 2014

(51) Int. Cl.
H01L 31/102 (2006.01)
H01L 29/861 (2006.01)

(52) U.S. Cl.
CPC .................. *H01L 29/861* (2013.01)

(58) Field of Classification Search
USPC ........................................... 257/295
See application file for complete search history.

(56) References Cited

U.S. PATENT DOCUMENTS

| | | | |
|---|---|---|---|
| 5,530,271 A * | 6/1996 | Fallica ........................... | 257/173 |
| 6,133,107 A * | 10/2000 | Menegoli ....................... | 438/306 |
| 6,184,545 B1 | 2/2001 | Werner et al. | |
| 7,045,830 B1 * | 5/2006 | Cai et al. ....................... | 257/139 |
| 2002/0137318 A1 * | 9/2002 | Peake et al. ................... | 438/585 |
| 2007/0166942 A1 * | 7/2007 | Cogan et al. .................. | 438/380 |
| 2008/0029812 A1 * | 2/2008 | Bhalla ............................ | 257/330 |
| 2012/0193676 A1 | 8/2012 | Bobde et al. | |
| 2013/0320915 A1 * | 12/2013 | Ahlers et al. ................... | 320/107 |

FOREIGN PATENT DOCUMENTS

| | | |
|---|---|---|
| DE | 4310444 A1 | 10/1994 |
| DE | 4410444 A1 | 9/1995 |
| DE | 102011080258 A1 | 2/2013 |
| JP | 2010199480 A | 9/2010 |

OTHER PUBLICATIONS

Unknown, "Evaluating of the Breakdown Voltage of the Super-Junctions Using ATLAS", Simulation Standard, Jul.-Sep. 2009, pp. 8-10.
Yamakazi, et al., "Forward Transient Behavior of PiN and Super Junction Diodes", Proceedings of 2004 International Symposium on Power Semiconductor Devices & ICs, Kitakyushu, pp. 197-200.

* cited by examiner

*Primary Examiner* — Thao P Le
(74) *Attorney, Agent, or Firm* — Murphy, Bilak & Homiller, PLLC

(57) ABSTRACT

In a semiconductor diode a semiconductor body includes an injection efficiency control region between a drift region of a first conductivity type and a first electrode region of a second, opposite conductivity type. The injection efficiency control region includes a superjunction structure including a barrier region of the first conductivity type and a compensation region of a second conductivity type arranged consecutively along a lateral direction and directly adjoining each other. A net dopant concentration of the barrier region averaged along a vertical extension of the barrier region is at least three times greater than a net dopant concentration of the drift region averaged along 20% of a vertical extension of the drift zone adjoining the barrier region.

22 Claims, 16 Drawing Sheets

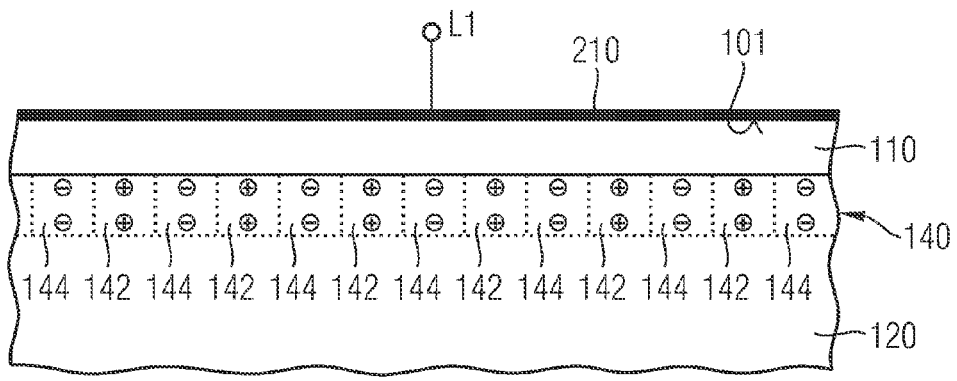
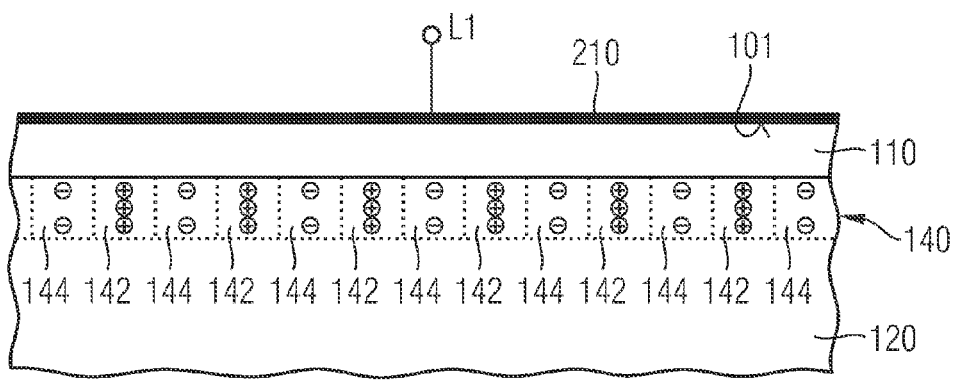
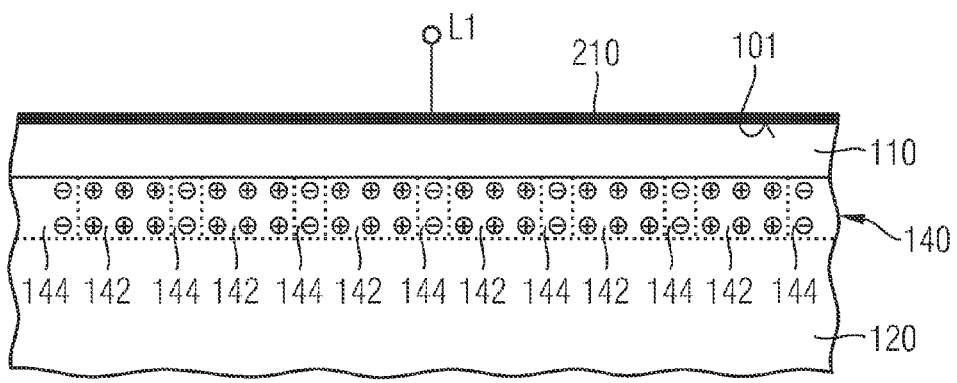

SEMICONDUCTOR DIODE

BACKGROUND

In semiconductor devices like semiconductor diodes mobile charge carriers flood the semiconductor regions on both sides of a forward biased pn junction and may form a charge carrier plasma that provides a low forward or on state resistance of the semiconductor device but that has to be removed in a reverse recovery period when the pn junction changes from forward biased to reverse biased. The reverse recovery process contributes to switching losses of the semiconductor device. It is desirable to provide a semiconductor diode having an optimized trade-off between low switching losses, a high reverse breakdown voltage, and a high peak current robustness.

SUMMARY

According to an embodiment of a semiconductor diode, the semiconductor diode comprises a semiconductor body comprising an injection efficiency control region between a drift region of a first conductivity type and a first electrode region of a second, opposite conductivity type. The injection efficiency control region comprises a superjunction structure comprising a barrier region of the first conductivity type and a compensation region of a second conductivity type arranged consecutively along a lateral direction and directly adjoining each other. A net dopant concentration of the barrier region averaged along a vertical extension of the barrier region is at least three times greater than a net dopant concentration of the drift region averaged along 20% of a vertical extension of the drift zone adjoining the barrier region.

According to an embodiment of a method of manufacturing a semiconductor diode in a semiconductor body comprising a drift region of a first conductivity type, the method comprises forming a first electrode region of a second, opposite conductivity type in the semiconductor body at a first surface of the semiconductor body. The method further comprises forming a superjunction structure between the drift region and the first electrode region, wherein the superjunction structure comprises a barrier region of the first conductivity type and a compensation region of the second conductivity type arranged consecutively along a lateral direction and directly adjoining each other. A net dopant concentration of the barrier region averaged along a vertical extension of the barrier region is at least three times greater than a net dopant concentration of the drift region averaged along 20% of a vertical extension of the drift zone adjoining the barrier region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 3A to 3F are schematic cross-sectional views of injection efficiency control regions of portions of semiconductor diodes in accordance with embodiments.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a greater doping concentration than an "n"-doping region. Doping regions of the same relative doping concentration do not necessarily have the same absolute doping concentration. For example, two different "n"-doping regions may have the same or different absolute doping concentrations.

Figure 1A:
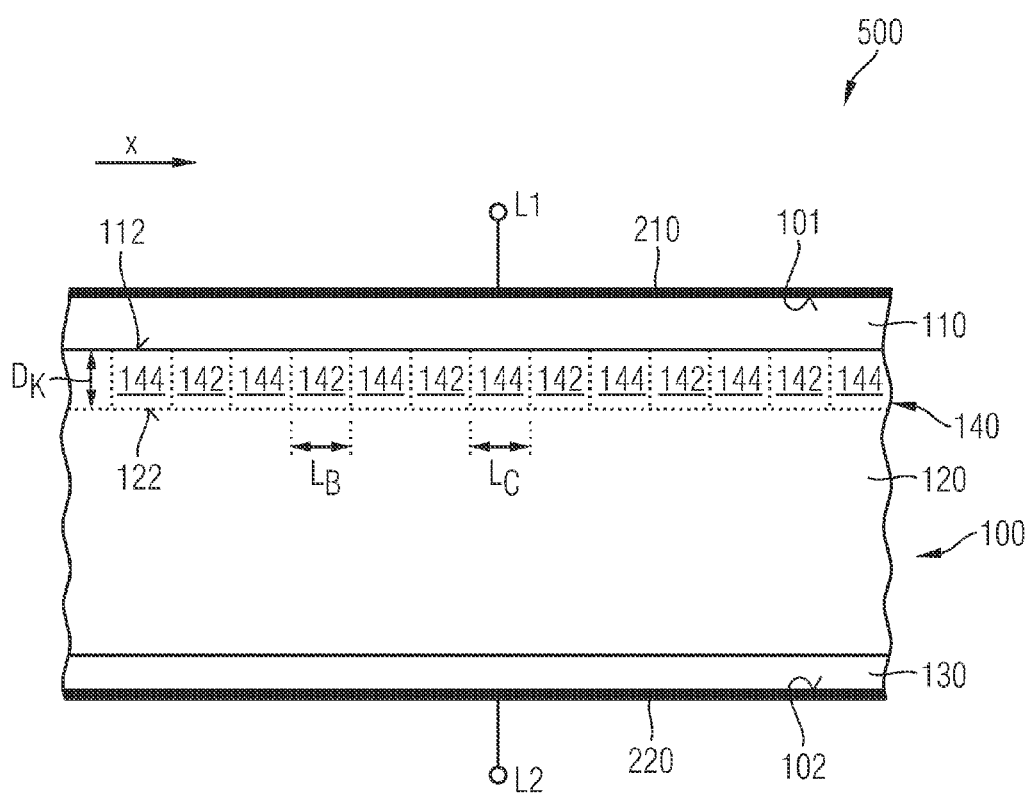
FIG. 1A is a schematic cross-sectional view of a portion of a semiconductor diode in accordance with an embodiment.

FIG. 1A shows a portion of a semiconductor diode 500. A semiconductor body 100 of the semiconductor diode 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be given by a plane spanned by coplanar surface sections, as well as a mainly planar second surface 102 parallel to the first surface 101. A minimum distance between the first and second surfaces 101, 102 is selected to achieve a specified voltage blocking capability of the semiconductor diode 500. For example, the distance between the first and second surfaces 101, 102 may be 90 μm to 110 μm for a diode specified for a blocking voltage of about 1200 V.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift region 120 of a first conductivity type, a first electrode region 110 of a second conductivity type, which is opposite to the first conductivity type, between the first surface 101 and the drift region 120 as well as a second electrode region 130 of the first conductivity type between the drift region 120 and the second surface 102. The first electrode region 110 may directly adjoin the first surface 101.

For the illustrated embodiments the first conductivity type is n-type and the second conductivity type is p-type. Thus, the first electrode region 110 may be an anode region and the second electrode region 130 may be a cathode region. Similar considerations as outlined below apply to embodiments with the first conductivity type being p-type and the second conductivity type being n-type.

A net dopant concentration, i.e. an absolute value of the difference between n-type dopant concentration and p-type dopant concentration in the drift region 120 may gradually or in steps increase or decrease with increasing distance to the first surface 101 at least in portions of its vertical width.

According to other embodiments the dopant concentration in the drift region 120 may be approximately uniform. For silicon devices a mean dopant concentration in the drift region 120 may be between $1 \times 10^{12}$ cm$^{-3}$ and $1 \times 10^{15}$ cm$^{-3}$, for example in a range from $5 \times 10^{12}$ cm$^{-3}$ to $5 \times 10^{14}$ cm$^{-3}$. For silicon carbide (SiC) devices, dopant concentration values and dopant concentration ranges may be one or two orders of magnitude higher than the exemplary values described herein. A mean dopant concentration for a n-type second electrode region 130 or n-type zones of the second electrode region 130 may be at least $1 \times 10^{16}$ cm$^{-3}$, for example at least $5 \times 10^{17}$ cm$^{-3}$.

A first load electrode 210 is electrically connected with the first electrode region 110. The first load electrode 210 may be or may be electrically coupled or connected to a first load terminal L1.

A second load electrode 220 directly adjoins the second surface 102 and the second electrode region 130. The second load electrode 220 may be electrically connected to a second load terminal L2.

Each of the first and second load electrodes 210, 220 may consist of or contain, as main constituent(s) aluminum (Al), copper (Cu), or alloys of aluminum or copper, for example AlSi, AlCu or AlSiCu. According to other embodiments, at least one of the first and second load electrodes 210, 220 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 210, 220 may include two or more sub-layers, wherein each sub-layer contains one or more of Ni, Ti, Ag, Au, Pt, W, and Pd as main constituent(s), e.g., a silicide, a nitride and/or an alloy.

An injection efficiency control region 140 is sandwiched between the drift region 120 and the first electrode region 110. The injection efficiency control region 140 comprises a super-junction structure comprising a barrier region 142 of the first conductivity type and a compensation region 144 of the second conductivity type arranged consecutively along a lateral direction x and directly adjoining each other.

The barrier region 142 sandwiched between the first electrode region 110 and the drift region 120 forms a pn junction with the first electrode region 110 and an n/n$^-$-homojunction with the drift region 120. A net dopant concentration of the barrier region 142 averaged along a vertical extension of the barrier region 142 is at least three times, or even at least ten times greater than a net dopant concentration of the drift region 120 averaged along 20% of a vertical extension of the drift zone 120 adjoining the barrier region 142. According to an embodiment, the net dopant concentration of the drift region 120 averaged along 20% of a vertical extension of the drift zone 120 adjoining the barrier region 142 may be between $1 \times 10^{12}$ cm$^{-3}$ and $1 \times 10^{15}$ cm$^{-3}$, for example in a range from $5 \times 10^{12}$ cm$^{-3}$ to $5 \times 10^{14}$ cm$^{-3}$. According to an embodiment, the net dopant concentration of the barrier region 142 averaged along a vertical extension of the barrier region 142 may range from $1 \times 10^{15}$ cm$^{-3}$ to $1 \times 10^{17}$ cm$^{-3}$, for example from $5 \times 10^{15}$ to $5 \times 10^{16}$ cm$^{-3}$. Examples for dopants comprise phosphorus (P), arsenic (As), selenium (Se) and/or sulfur (S).

A total dopant quantity (effective electrode dose) in the first electrode region 110 is set such that it prevents a depletion region extending from the pn junction between the first electrode region 110 and the barrier region 142 from reaching the first surface 101 or a contact structure that extends from the first surface 101 into the semiconductor body 100 at the operation conditions the semiconductor diode 500 is specified for.

When the pn junction between the first electrode region 110 and the barrier region 142 is forward biased the first electrode region 110 injects minority-type charge carriers through the barrier region 142 into the drift region 120. The barrier region 142 virtually reduces the effective anode dose and hence an anode emitter efficiency without reducing the actual dopant dose within the first electrode region 110.

Current methods for reducing the anode efficiency in the injection region aim at reducing the effective anode dose in the first electrode region 110, for example by reducing the implant dose and/or removing portions of the first electrode region 110 after the implant. However, reliably controlling a small anode dose has turned out to be a delicate process with low yield. Instead, the barrier region 142 reduces the anode emitter efficiency without reducing the effective anode dose in the first electrode region 110, thereby avoiding critical processes with low yield. In addition, the barrier region 142 may increase the ruggedness against critical current filamentation events in the semiconductor body 100.

According to an embodiment, the barrier region 142 further contains at least one deep level donor or deep double donor, e.g., sulfur and/or selenium atoms/ions. With deep level donors, the doping level increases with increasing temperature, wherein a locally increasing doping level locally reduces anode emitter efficiency and thus counteracts an inhomogeneous current distribution among parallel cells.

The compensation region 144 sandwiched between the first electrode region 110 and the drift region 120 forms a pn junction with the drift region 120 and the barrier region 142, and a $p/p^+$- or $p+/p$- or p/p-homojunction with the first electrode region 110. A mean dopant concentration in the compensation region 144 may range from $1 \times 10^{15}$ cm$^{-3}$ to $1 \times 10^{17}$ cm$^{-3}$, for example from $5 \times 10^{15}$ to $5 \times 10^{16}$ cm$^{-3}$. Examples for dopants comprise boron (B), indium (In), aluminum (Al) or gallium (Ga).

The compensation region 144 together with the barrier region 142 constitutes the superjunction structure to achieve a high reverse breakdown voltage of the semiconductor diode 500. In particular, in a reverse blocking mode the complementary doped regions 142, 144 are depleted such that a high reverse breakdown voltage can be achieved even at a comparatively high dopant concentration in the doped regions carrying the on-state current. This effect results from the fact that, when a reverse blocking voltage is applied between the first electrode region 110 and the drift region 120, the compensation region 144 and the barrier region 142 get depleted starting from the vertical pn junction between the compensation region 144 and the barrier region 142. Due to the intrinsic electrical field along a lateral direction in addition to the electrical field applied between the first electrode region 110 and the drift region 120, a high reverse breakdown voltage can be achieved.

As shown in FIG. 1A, the barrier region 142 may comprise a plurality of barrier regions 142 and the compensation region 144 may comprise a plurality of compensation regions 144, which are arranged parallel to the first surface 101 and/or the second surface 102 and are further arranged in an orthogonal direction to a current flowing through the semiconductor diode 500. The barrier regions 142 and the compensation regions 144 are arranged in an alternating manner such that each of the barrier regions 142 is directly neighboured by two compensation regions 144, wherein the boundary between one of the barrier regions 142 and a neighbouring compensation region 144 may be parallel to a vertical direction orthogonal to the first surface 101 and/or the second surface 102.

Figure 1B:
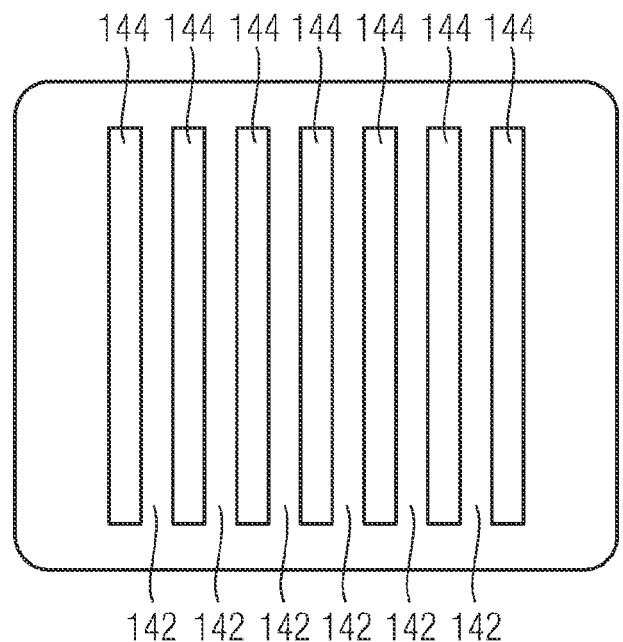
FIG. 1B is a schematic plan view of a portion of a semiconductor diode in accordance with an embodiment.

As shown in FIG. 1B, the compensation regions 144 may be arranged as stripes along a lateral direction in an alternating manner with the barrier regions 142, which may also be arranged as stripes and neighbouring or surrounding the compensation regions 144.

Figure 1C:
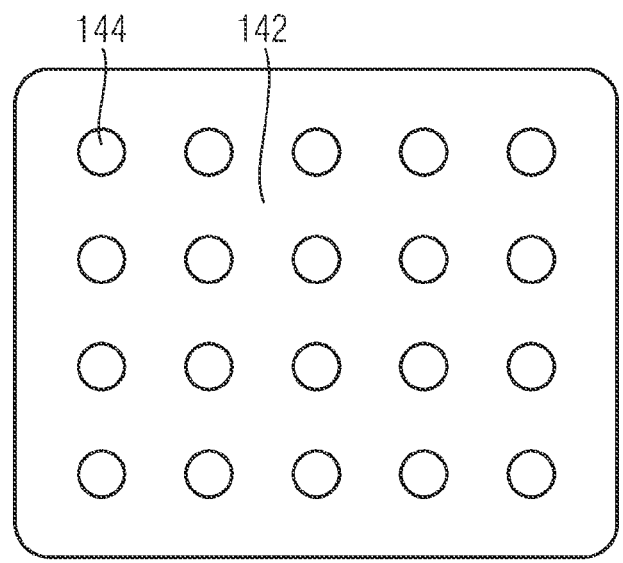
FIG. 1C is a schematic plan view of a portion of a semiconductor diode in accordance with another embodiment.

As shown in FIG. 1C, the compensation regions 144 may also be arranged in a regular, matrix-like pattern of cells in equally spaced lines and columns, wherein the compensation regions 144 are neighboured or surrounded by the barrier region 142. According to another embodiment, arrangement of the compensation and barrier regions 144, 142 may be invers with respect to FIG. 1C, i.e. barrier regions 144 are neighboured or surrounded by the compensation region 142. Although a multitude of barrier regions 142 and compensation regions 144 are shown in the cross-sectional view of FIG. 1A, it is also possible that the barrier regions 142 are connected, for example, in an edge termination region to form a continuous barrier region 142 (cf. FIG. 1B and FIG. 1C). The same may be applied to the compensation regions 144. The barrier regions 142 and the compensation regions 144 may, however, also be arranged in a different manner provided that the barrier regions 142 are in electrical contact with both the first electrode region 110 and the drift region 120 and directly neighboured by or directly abutting to compensation regions 144 along a vertical direction. Further arrangements of the barrier regions 142 and the compensation regions 144 may thus be provided, which fulfil the requirement that an intrinsic electrical field in a lateral direction exists between the barrier regions 142 and the compensation regions 144 to form a superjunction structure.

The barrier regions 142 and the compensation regions 144 extend from a first boundary surface area 112 between the first electrode region 110 and the injection efficiency control region 140 into the semiconductor body 100 to a second boundary surface area 122 between the injection efficiency control region 140 and the drift region 120 along a vertical direction, having a vertical extent $D_k$. According to an embodiment, the barrier regions 142 and the compensation regions 144 each have the same vertical extent $D_k$. Thus, a bottom side of the barrier region 142 and the compensation region 144 is at a same vertical level. The barrier region 142 and the compensation region 144 may, however, have different depths provided that the barrier region 142 are in electrical contact with both the first electrode region 110 and the drift region 120 and are further in direct contact with the compensation regions 144.

As shown in FIG. 1A, the barrier regions 142 have a width $L_B$ in a lateral direction and the compensation regions 144 have a width $L_C$ along a lateral direction. In an embodiment, the barrier regions 142 and the compensation regions 144 each have a same width $L_B$, $L_C$ along a lateral direction. In another embodiment, the compensation regions 144 may have a small width compared to the width of the barrier regions 142, wherein the ratio of widths along the lateral direction of the barrier regions 142 and the compensation regions 144 may be greater than 2, greater than 3 or greater than 5. In yet another embodiment, the barrier regions 142 may have a small width compared to the width of the compensation regions 144, wherein the ratio of widths along the lateral direction of the compensation regions 144 and the barrier regions 142 may be greater than 2, greater than 3 or greater than 5. The barrier regions 142 achieve a local reduction of the p-emitter efficiency of the semiconductor diode 500, wherein the barrier regions 142 are provided with compensation regions 144, to compensate the reduction in voltage blocking capability of the semiconductor diode 500.

Figure 2:
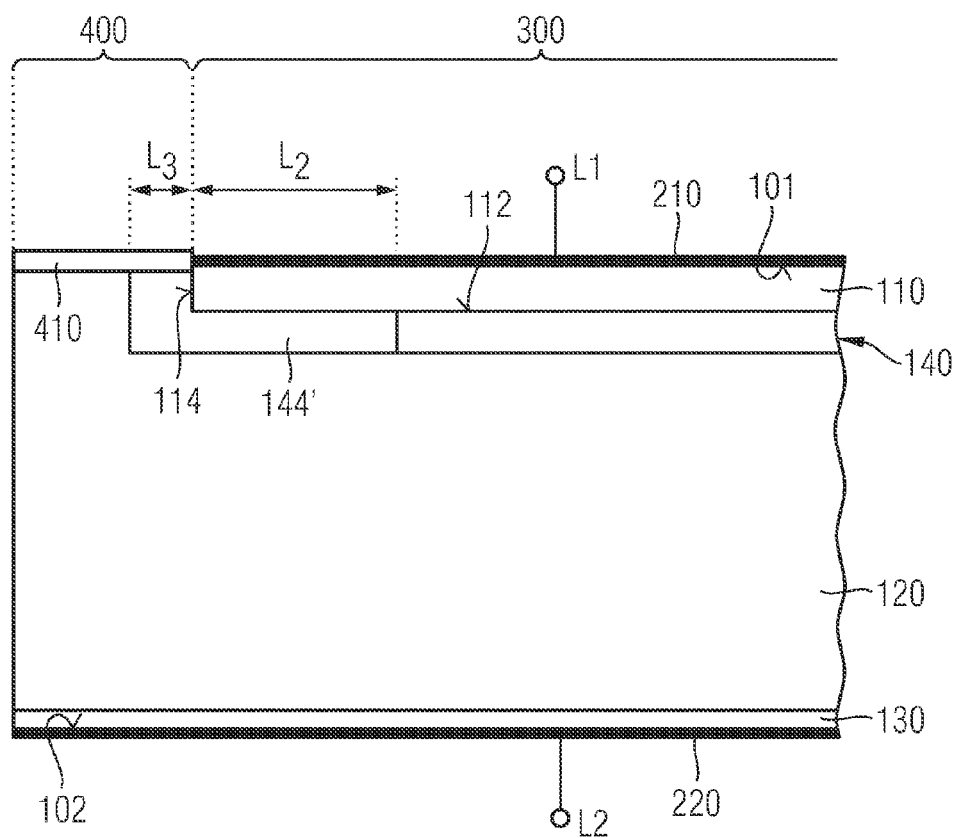
FIG. 2 is a schematic cross-sectional view of a portion of a semiconductor diode in accordance with another embodiment.

FIG. 2 is a cross-sectional view of a portion of a semiconductor diode 500 including an active region 300 with the first electrode region 110 and an edge termination region 400 with an edge termination structure 410. The edge termination structure 410 may be a field plate structure, a junction termination extension (JTE) structure, a variation of lateral doping (VLD) structure or another structure adapted to form an edge termination of the semiconductor diode 500. The injection efficiency control region 140 sandwiched between the drift region 120 and the first electrode region 110 adjoins a compensation region 144' being sandwiched between the first electrode region 110 and the drift region 120 and being further arranged to laterally overlap a boundary region including a part of the active region 300 with the first electrode region 110 and a part of the edge termination region 400 with the edge termination structure 410. Thus, the superjunction structure laterally overlaps a boundary between the active region 300 comprising the first electrode region 110 and the edge termination structure 410. The compensation region 144' may adjoin the first electrode region 110 not only at the lateral first boundary surface area 112 but also at a vertical boundary surface area 114 and may further reach to the edge termination structure 410 to form an edge termination structure for the active region 300 of the semiconductor diode 500. By providing the modified compensation region 144' in the boundary region between the active region 300 and the edge termination region 400, a reduction of the charge carrier plasma in the edge region of the semiconductor diode in an on-state may be achieved, resulting in a prevention of a dynamic avalanche within abrupt switching operations.

In FIGS. 3A to 3F, several embodiments of the semiconductor diode 500 are shown. Although the embodiments are illustrated in different FIGS. 3A to 3F, the features shown in these Figures may also be arbitrarily combined, if not explicitly excluded.

As shown in FIG. 3A, the vertical depth and the lateral width of the barrier regions 142 and the compensation regions 144 may be equal. In addition, the net dopant concentration of the barrier regions 142 and the compensation regions 144 may also be equal such that the overall net amount of dopants in all of the barrier regions 142 is fully or almost fully compensated by the overall net amount of dopants in all of the compensation regions 144. According to an embodiment, a net amount of dopants in the barrier regions 142 and a net amount of dopants in the compensation regions 144 differ by less than 10% or even by less than 5%. The barrier regions 142 and the compensation regions 144 may also be arranged in a different manner, provided that the overall amount of donors in all of the barrier regions 142 (in case the first conductivity type is an n-type) is fully compensated by the overall amount of acceptors in all compensation regions 144.

As shown in FIGS. 3B and 3C, the overall net amount of dopants in all of the barrier regions 142 may also be greater than the overall net amount of dopants in all compensation regions 144. In the case that the barrier regions 142 are of an n-type and the compensation regions 144 are of a p-type, the overall net amount of donors within each barrier region 142 overcompensates the overall net amount of acceptors in each compensation region 144 and leads to an overall excess of donors within the injection efficiency control region 140.

The overcompensation of acceptors in the compensation regions 144 by the donors in the barrier regions 142 may be achieved in that a net dopant concentration in each of the barrier regions 142 is greater than a net dopant concentration in each of the compensation regions 144 while each of both regions 142, 144 having a same width and depth or a comparable structure, as shown in FIG. 3B.

An overcompensation of acceptors by donors can also be achieved by providing the barrier regions 142 and the compensation regions 144 with equal net dopant concentrations of opposite conductivity types while having a different structure. As shown in FIG. 3C, the barrier region 142 and the compensation regions 144 have a different lateral width while having equal net dopant concentrations of opposite conductivity type. Although an overcompensation of acceptors by donors is shown in FIGS. 3B and 3C, it is also possible to provide an overcompensation of donors by acceptors according to another embodiment.

Figure 3D:
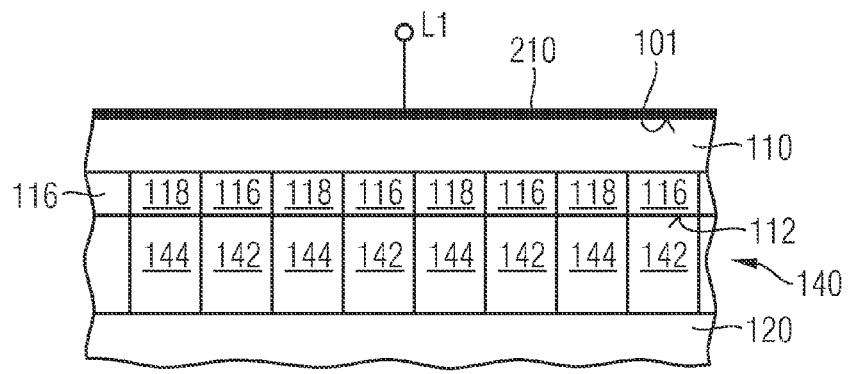

As shown in FIG. 3D, a net dopant concentration of the first electrode region 110 comprises a lateral variation, e.g. a net dopant concentration of a first zone 116 of the first electrode region 110 directly adjoining the barrier region 142 may be greater than a net dopant concentration of a second zone 118 of the first electrode region 110 directly adjoining the compensation region 144. The first zone 116 and the second zone 118 of the first electrode region 110 adjoin a first boundary surface area 112 between the first electrode region 110 and the injection efficiency control region 140 and extend into the first electrode region 110 towards the first surface 101. The first zone 116 and the second zone 118 may extend to a same depth into the first electrode region 110. The first zone 116 and the second zone 118 may also have different depths. Further, one of the first and second zones 116, 118 or both zones 116, 118 may fully extend up to the first surface 101. Furthermore, a gradual transition in net dopant concentration from the first surface 101 towards the first boundary surface area 112 may be provided.

Figure 3E:
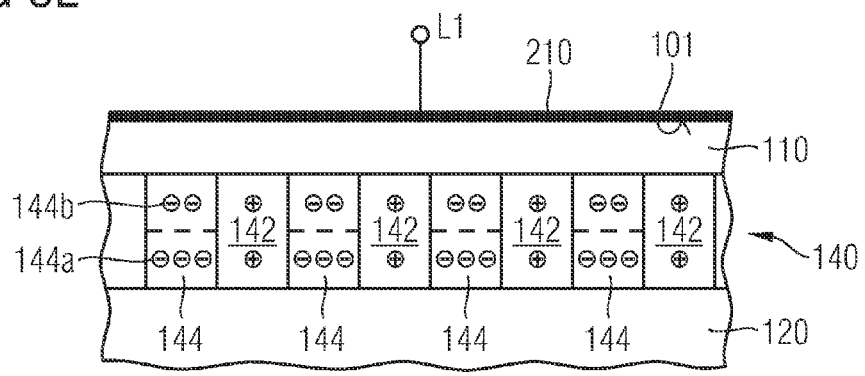

In FIG. 3E, a cross-sectional view of a semiconductor diode 500 in accordance with a further embodiment is shown. In this embodiment, a net dopant concentration comprises a vertical variation, and a net dopant concentration of a first zone 144a of the compensation region 144 adjoining the drift region 120 is greater than a net dopant concentration of a second zone 144b of the compensation region 144 adjoining the first electrode region 110. Although a boundary surface area between the first zone 144a and the second zone 144b having different net dopant concentrations is shown in FIG. 3E, the transition between the first zone 144a having a greater net dopant concentration to the second zone 144b having a lower net dopant concentration may be provided gradually. The transition from a lower net dopant concentration to a greater net dopant concentration may also be provided in a lower part nearer to the drift zone 120 or in an upper part nearer to the first electrode region 110.

Figure 3F:
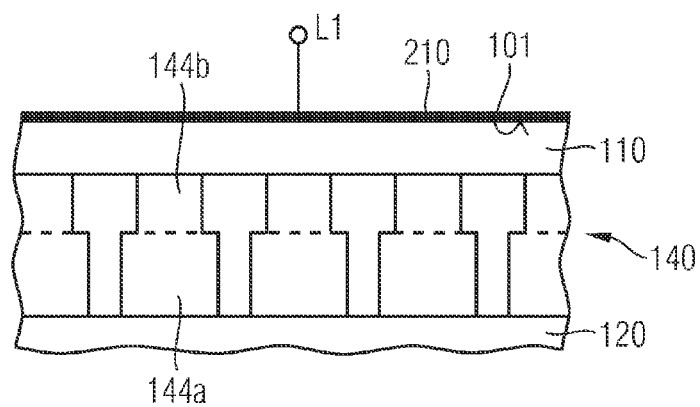

As shown in FIG. 3F, a lateral width of a first zone 144a of the compensation regions 144 adjoining the drift region 120 may further be greater than a width of a second zone 144b of the compensation region 144 adjoining the first electrode region 110. The variation of net dopant concentration profile as shown in FIG. 3E and the variation of the lateral width of the compensation regions 144 as shown in FIG. 3F may also be arbitrarily combined for optimizing the characteristics of a semiconductor diode 500 having the injection efficiency control region 140 being sandwiched between the first electrode region 110 and the drift region 120.

Figure 4A:
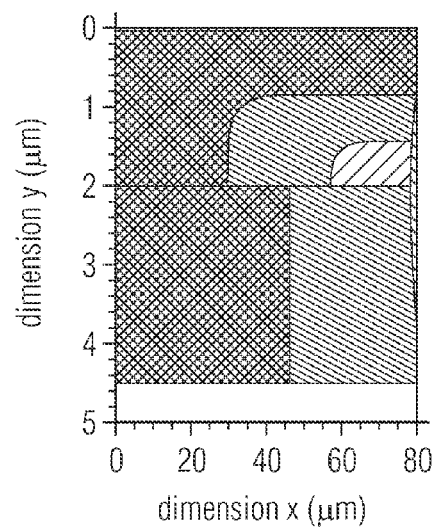
FIG. 4A is a diagram illustrating a net dopant concentration profile of a compensation region in accordance with an embodiment.
Figure 4B:
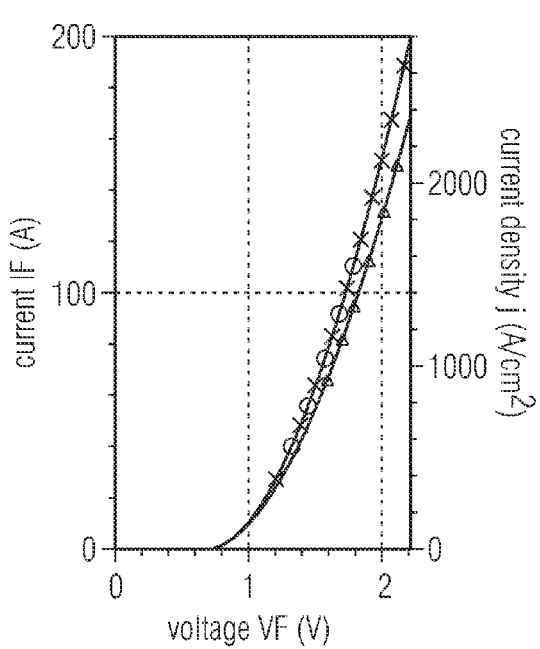
FIGS. 4B and 4C are diagrams showing characteristic curves of a semiconductor diode having an injection efficiency control region with compensation regions in accordance with the embodiment of FIG. 4A.
Figure 4C:
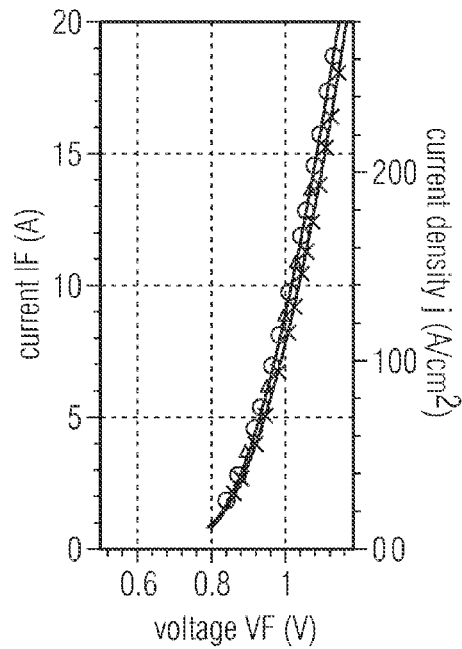

A simulation of a structure including a compensation region 144 having a laterally extended compensation region as shown in FIG. 3F is shown in FIGS. 4A to 4C.

As illustrated in FIG. 4A, the compensation region is located in the lower part on a left side (x<40 μm) and is in an upper part (y<2 μm) narrowed to the left side (x<40 μm). The drift region is in a lower part (y>4.5 μm) and the first electrode region is in an upper part (y<1 μm). FIGS. 4B and 4C show simulated diagrams with static forward characteristics (FIG. 4C is a detailed view of FIG. 4B), wherein the curves marked with circles are related to a current through the complete structure (left axis indicating the current IF(A)), the curves marked with crosses are related to a mean current density within the compensation region 144 (right axis indicating the current density $j(A/cm^2)$) and the curves marked with triangles are related to a mean current density between the compensation regions (right axis indicating the current density $j(A/cm^2)$).

By the provision of the structure as shown in FIG. 3F, a voltage drop along a lateral direction is enhanced at high currents such that the values of the diffusion voltage at the pn junction between the compensation region 144 and the drift region 120 is exceeded, which leads to a strong hole injection of the compensation regions 144 into the drift region 120. Such a simulation of a structure is shown in FIGS. 4A to 4C. For current densities of lower than 200 A/cm² more current flows in a region between the compensation regions 144 which is changed for greater current densities. According to the embodiment, the second zone 144b of the compensation regions 144 adjoining the first electrode region 110 is provided to compensate the electric field in the current direction and the first zone 144a of the compensation regions 144 adjoining the drift region 120 having a greater lateral width than the second zone 144b of the compensation regions 144 is provided to compensate the electrical field in current direction and to additionally provide a high hole injection at high currents into the drift zone 120. This allows for an improvement in surge current robustness.

Figure 5A:
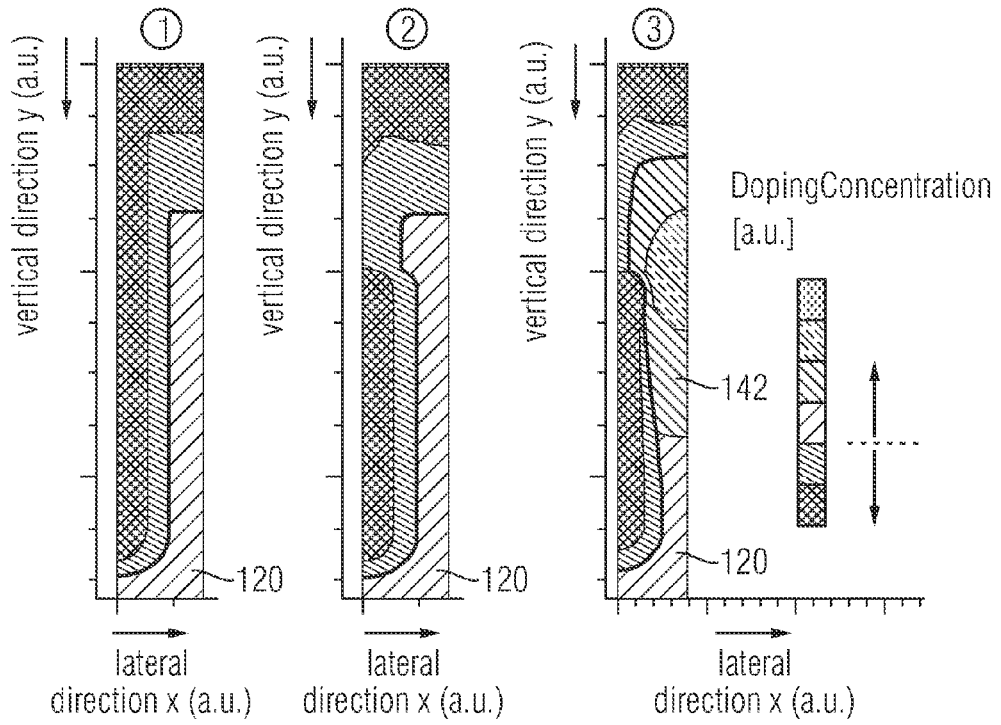
FIG. 5A is a diagram illustrating a net dopant concentration profile of a compensation region according to different embodiments.

FIGS. 5A to 5E illustrate different structures of the compensation region 144 and the resulting characteristics for the semiconductor diode. In detail, FIG. 5A shows a structure (1) of a homogeneous compensation region without a barrier region, structure (2) shows a compensation region with vertical variation in net dopant concentration and without a barrier region and structure (3) shows a compensation region with vertical variation in net dopant concentration and with a barrier region. The doping concentration profile is depicted for the different structures (1) to (3) in FIG. 5A.

Figure 5B:
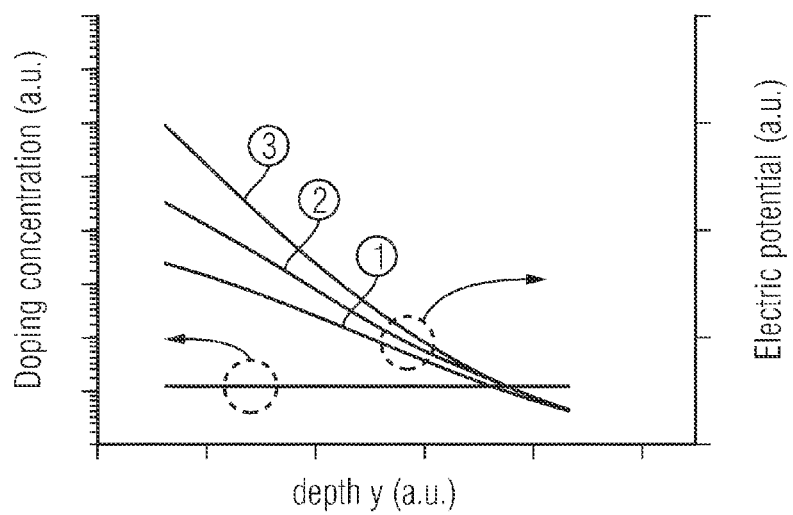
FIGS. 5B and 5C are diagrams showing a doping concentration profile in dependence of the depth along a vertical direction of a compensation region in accordance with the first, second and third embodiment.
Figure 5C:
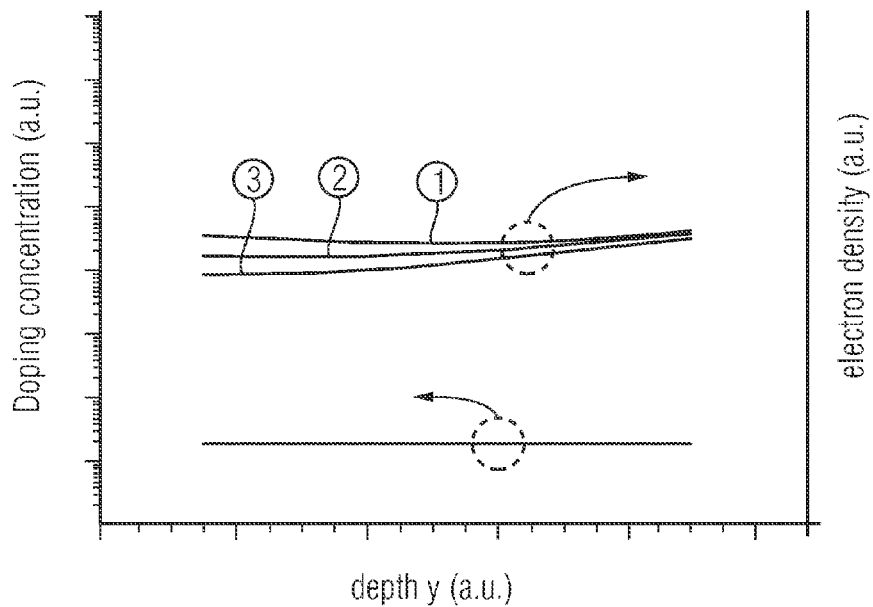

FIGS. 5B and 5C show an electrostatic potential (FIG. 5B) and an electron density (FIG. 5C) vs. a depth Y extending into the semiconductor body. Thus, varying lateral dimension(s) and/or net dopant concentration of the compensation region and arrangement of the barrier region allows for a desired adjustment of anode efficiency.

Figure 5D:
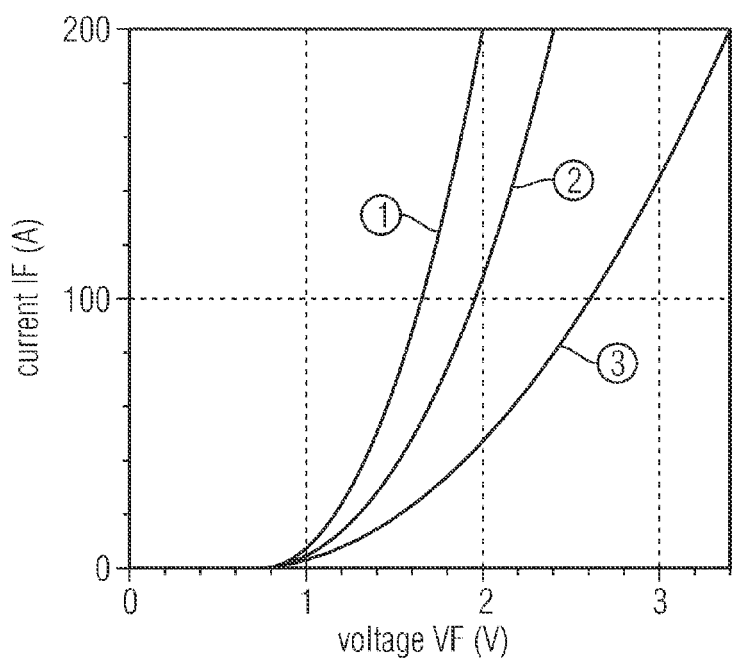
FIGS. 5D and 5E are diagrams showing characteristic curves of semiconductor diodes having an injection efficiency control region with compensation regions according to a first, second and third embodiment.
Figure 5E:
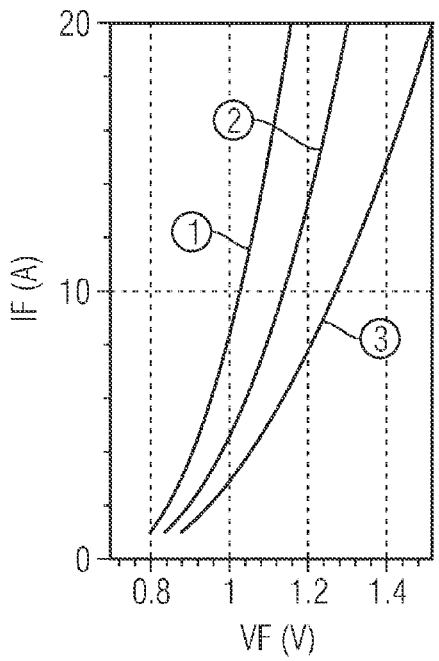

FIGS. 5D and 5E show static forward characteristics of the three structures (1), (2) and (3). As can be seen from FIG. 5D, the current characteristic IF is shifted to greater forward voltages VF when changing the structure from structure (1) to structure (2) to structure (3) including the barrier region. A detailed view of FIG. 5D is shown in FIG. 5E illustrating the voltage range between 0.7 V and 1.5 V.

Figure 6:
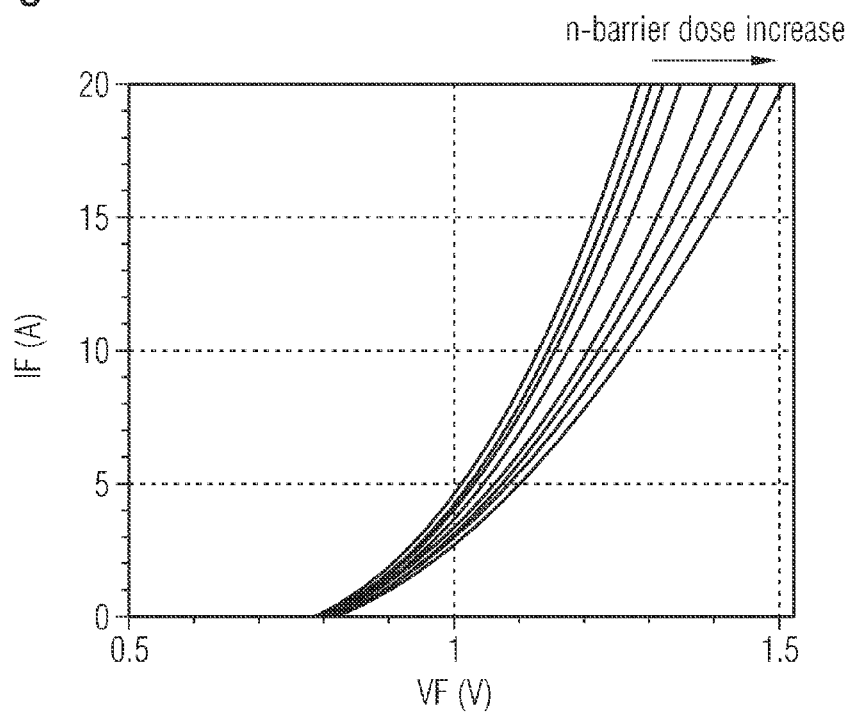
FIG. 6 is a diagram illustrating current vs. voltage characteristics of semiconductor diodes in dependence of the net dopant concentration of the barrier region of the injection efficiency control region.

A dependence of the characteristics of the semiconductor diode 500 on the net dopant concentration of the barrier regions is shown in FIG. 6.

By providing a variation of net dopant concentration along a vertical direction within the compensation region 144, a current flow through the compensation region 144 can be significantly reduced. The emitter injection efficiency is thus reduced. Both measures, the provision of barrier regions 142 and a second zone 144b of the compensation regions 144 adjoining the first electrode region 110 having a relatively low net dopant concentration lead to a strong shift of the forward characteristics of the semiconductor diode in the forward voltage direction. In case the forward voltage should be kept constant, the structure as shown in FIG. 3E and the structure (3) of FIG. 5A enables an enhancement of the homogeneous doping of the compensation regions, by which an additional dynamic punch through of the space-charge region is prevented.

Figure 7:
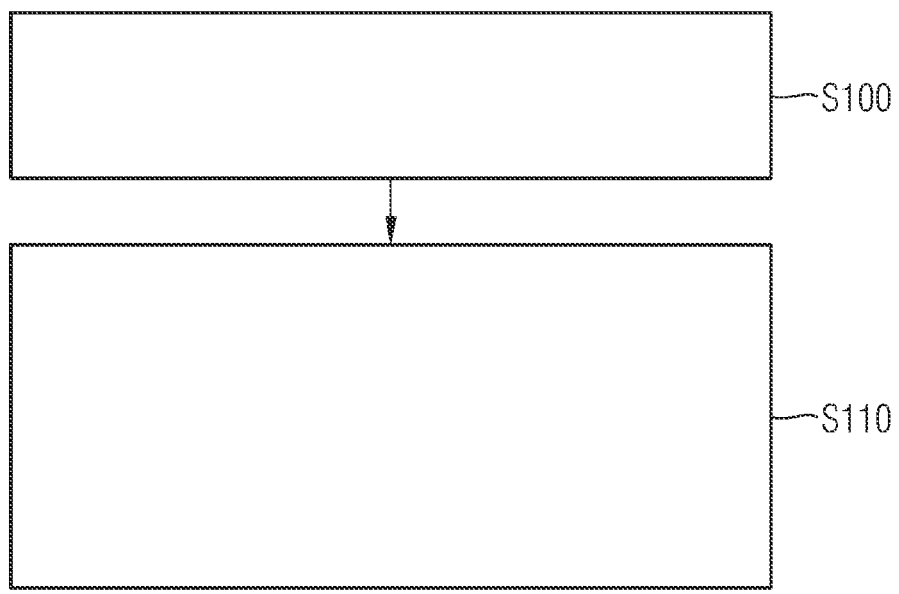
FIG. 7 is a flow-chart illustrating a method of manufacturing a semiconductor diode in accordance with an embodiment.

FIG. 7 shows a flowchart of a method of manufacturing a semiconductor diode in a semiconductor body comprising a drift region of a first conductivity type according to an embodiment. In process feature 5100, a first electrode region of a second, opposite conductivity type in the semiconductor body at a first surface of the semiconductor body is formed. In process feature 5110, a superjunction structure between the drift region and the first electrode region is formed, wherein the superjunction structure comprises a barrier region of the first conductivity type and a compensation region of the second conductivity type arranged consecutively along a lateral direction and directly adjoining each other. A net dopant concentration of the barrier region averaged along a vertical extension of the barrier region is at least three times greater than a net dopant concentration of the drift region averaged along 20% of a vertical extension of the drift zone adjoining the barrier region.

In FIG. 8A to 8D, a method of manufacturing the semiconductor diode 500 according to an embodiment will be described with reference to cross-sectional views for illustration of selected processes. In this method, the process of forming the barrier region 142 comprises introducing dopants of the first conductivity type through the first surface 101 into the semiconductor body 100, wherein a diffusion constant of the dopants is greater than a diffusion constant of other dopants of the first electrode region 110.

Figure 8A:
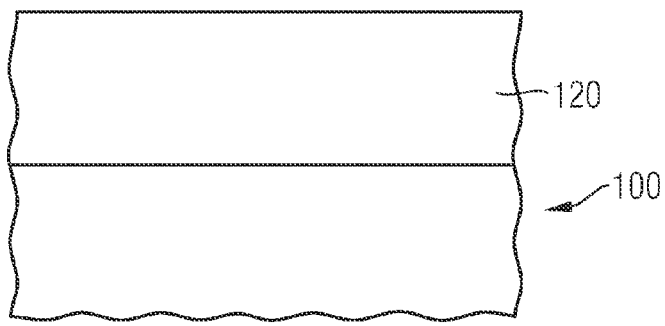
FIGS. 8A to 8D are cross-sectional views illustrating a method of manufacturing a semiconductor diode in accordance with an embodiment.
Figure 8B:
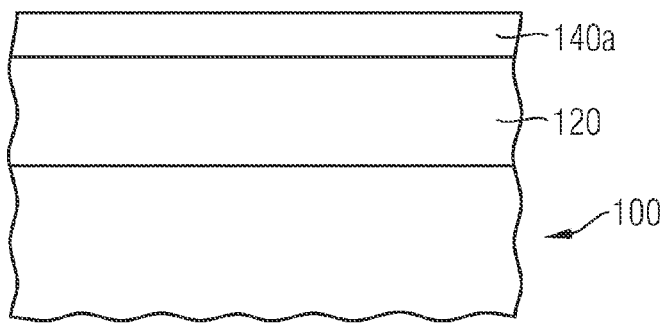

As can be seen in FIGS. 8A and 8B, a barrier layer 140a of the first conductivity type is formed on a drift region 120 within a semiconductor body 100, e.g. by epitaxial growth or deposition. The barrier layer 140a may also be formed by introducing dopants of the first conductivity type into the drift zone 120 such that a net dopant concentration of the barrier layer 140a averaged along a vertical extension of the barrier layer 140a is at least three times greater than a net dopant concentration of the drift region averaged along 20% of a vertical extension of the drift zone 120 adjoining the barrier layer 140a.

Figure 8C:
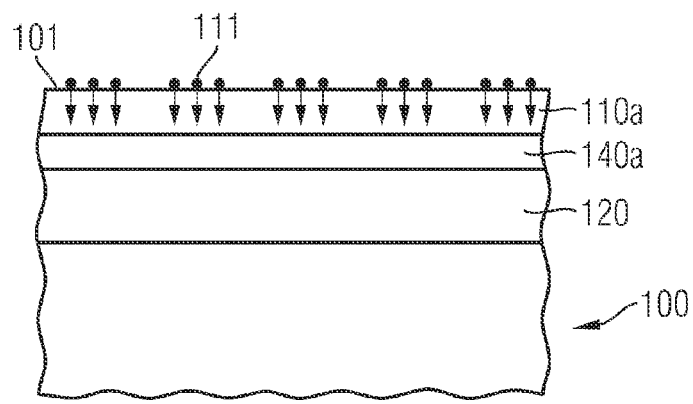
Figure 8D:
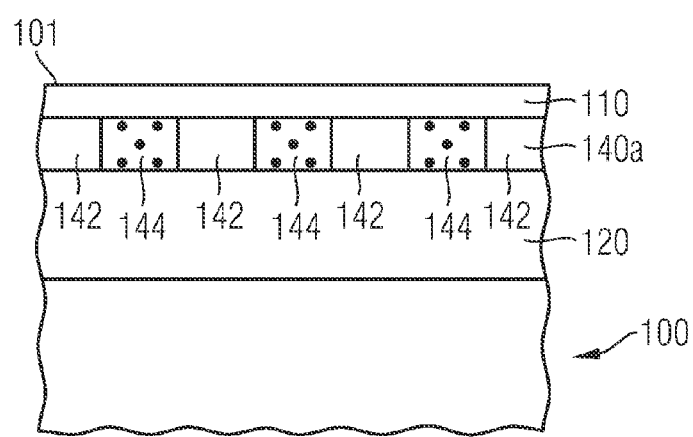

As shown in FIGS. 8C and 8D, a first electrode layer 110a of the second conductivity type is formed on the barrier layer 140a. In addition, dopant source zones 111 including dopants of the second conductivity type are formed on the first surface 101 on the first electrode layer 110a, wherein a diffusion constant of the dopants is greater than a diffusion constant of other dopants of the first electrode layer 110a. In a following diffusion step, the compensation regions 144 are formed by diffusion of the dopants of the dopant source zones 111 through the first surface 101 into the barrier layer 140a, thereby forming alternating barrier regions 142 and compensation regions 144 within the injection efficiency control region 140 sandwiched between the first electrode region 110 and the drift region 120.

In FIGS. 9A to 9F, a method of manufacturing the semiconductor diode 500 according to another embodiment will be described with reference to cross-sectional views for illustration of selected processes. In this process, forming the superjunction structure further comprises forming a trench 140b in the semiconductor body 100 at the first surface, and introducing dopants through a sidewall of the trench 140b into the semiconductor body 100.

Figure 9A:
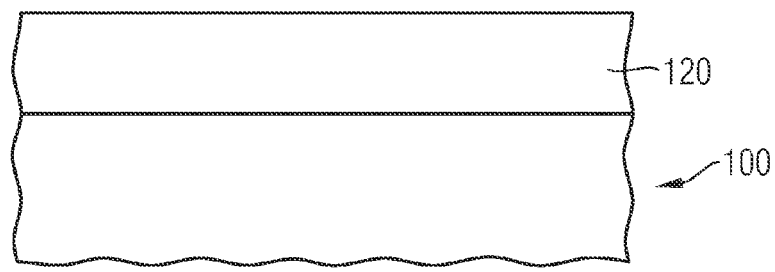
FIGS. 9A to 9F are cross-sectional views illustrating a method of manufacturing a semiconductor diode in accordance with another embodiment.
Figure 9B:
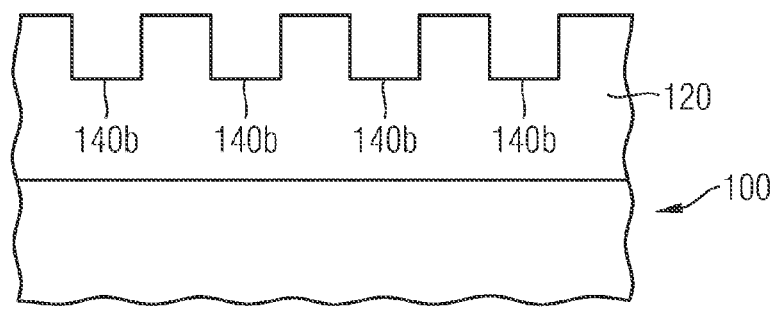

As shown in FIG. 9A, a drift region 120 is formed within the semiconductor body 100. As shown in FIG. 9B, trenches 140b are formed within the semiconductor body 100, wherein parts of the semiconductor body 100 being intended to be formed as barrier regions 142 are removed.

Figure 9C:
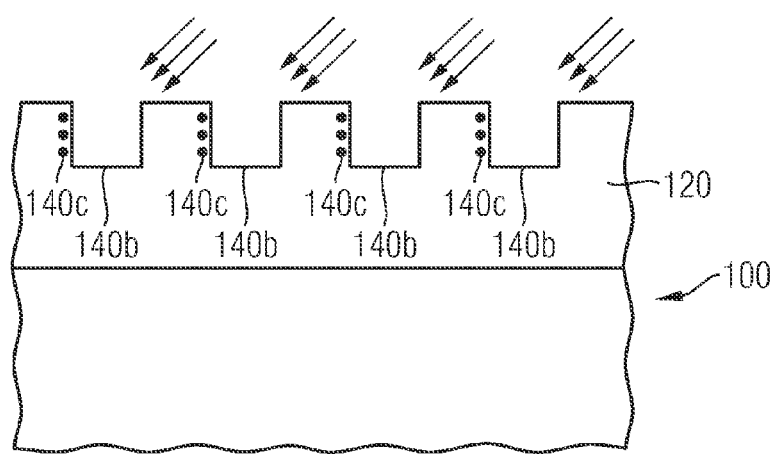
Figure 9D:
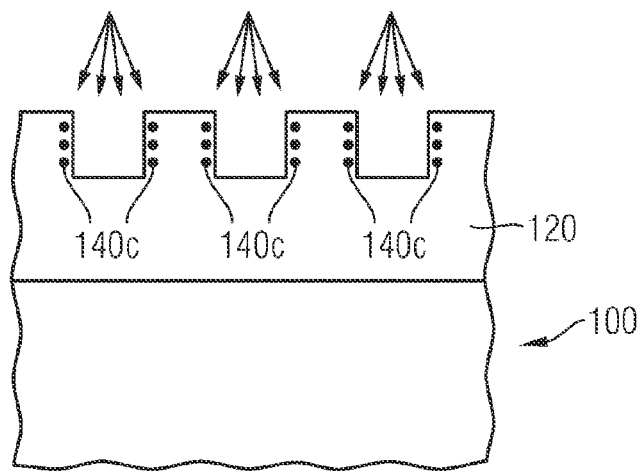

As shown in FIG. 9C or in FIG. 9D, dopant zones 140c are formed within the semiconductor body 100 adjoining the inner trench walls of the trenches 140b to form the compensation zones 144 by a tilted ion implantation process (FIG. 9C) or by a plasma doping process (FIG. 9D).

As shown in FIG. 9C, dopants are introduced into a layer of the semiconductor body 100 lining the sidewalls of the trenches 140b by a tilted ion implantation process. For doping of the semiconductor body 100 via the sidewalls of the trenches 140b down to the bottom part of the trenches 140b, the implantation angle should be chosen with respect to the aspect ratio of the trenches 140b. In the illustrated example, only one lateral side of the trenches 140b is doped, since the opposite side of the trenches 140b is shadowed by the semiconductor body 100. The opposite side of the trenches 140b may also be doped by repeating the above tilted ion implantation process under a different angle.

In another embodiment shown in FIG. 9D, dopants are introduced uniformly in the patterned part of the semiconductor body 100 via the sidewalls of the trenches 140b by a plasma doping process. Plasma doping of the barrier layer 140a via sidewalls of the trenches 140b allows high dose implants at low energies and is also known as PLAD (plasma doping) or PIII (plasma immersion ion implantation). These methods allow for a precise doping of the barrier layer 140a at the trench sidewalls. A conformal doping of the barrier layer 140a at the trench sidewalls can be achieved by applying a voltage to a substrate surrounded by a radio frequency (RF) plasma including a dopant gas. Collisions between ions and neutral atoms as well as the biasing of the semiconductor body 100 lead to a broad annular distribution of the dopants allowing for a homogeneous doping over the trench sidewalls.

When doping with PLAD, the semiconductor body 100 having the trenches 140b is exposed to a plasma including ions of dopants. These ions are accelerated by an electric field towards the semiconductor body 100 and are implanted into an exposed surface of the semiconductor body 100. An implanted dose can be adjusted or controlled via DC voltage pulses, e.g. negative voltage pulses. A Faraday system allows to adjust or control the dose. Two sets of coils, i.e. a horizontal coil and a vertical coil allow to generate the plasma and keep it homogeneous. An ion density can be adjusted via a distance between the coils and the substrate. Interaction between the vertical coils and the horizontal coils allows to adjust or control homogeneity and the ion density.

A penetration depth of the dopants into the barrier layer 140a and the implant dose may be adjusted via a pulsed DC voltage applied between the semiconductor body 100 and a shield ring surrounding it.

According to an embodiment, doping the semiconductor body 100 by plasma doping includes introducing the dopants into the barrier layer 140a via the sidewalls at a dose in a range of $5 \times 10^{11}$ cm$^{-2}$ to $3 \times 10^{13}$ cm$^{-2}$, or in a range of $1 \times 10^{12}$ cm$^{-2}$ to $2 \times 10^{13}$ cm$^{-2}$. This comparatively low dose requires modifications of the pulsed DC voltage typically used. Typically doses exceeding $10^{15}$ cm$^{-2}$ are implanted by these techniques. According to an embodiment, a pulse distance of the DC voltage pulses is adjusted in a range of 100 μs to 10 ms, in particular between 500 μs and 5 ms. A DC voltage pulse rise time is set to a value smaller than 0.1 μs, for example. According to an embodiment a pulse width ranges between 0.5 μs to 20 μs, or between 1 μs to 10 μs.

Figure 9E:
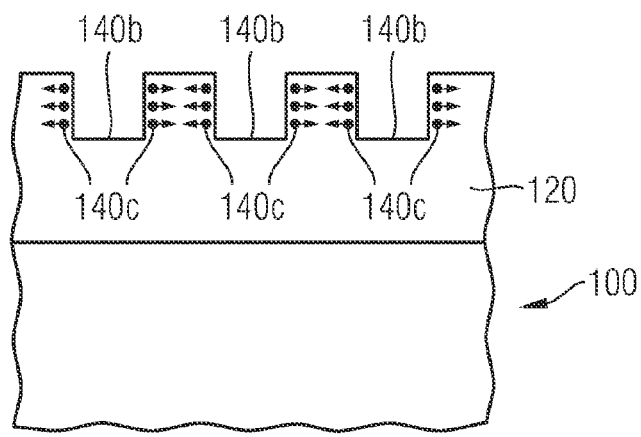
Figure 9F:
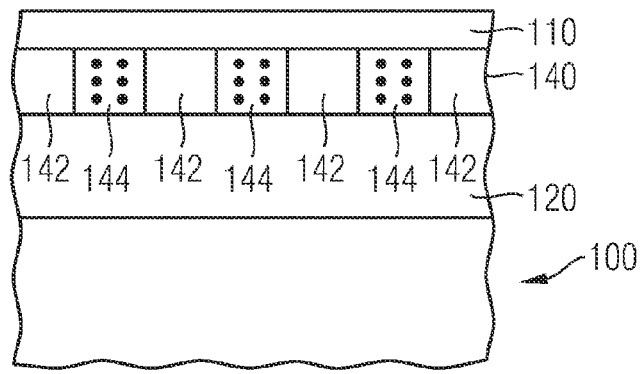

After a diffusion step in FIG. 9E, the compensation regions 144 are formed in a thermal treatment and activation step. In addition, the barrier regions 142 are formed between the compensation regions 144, e.g. by epitaxial growth or deposition, thereby filling the trenches, and the first electrode region 110 is formed on the injection efficiency control region 140 comprising the barrier regions 142 and the compensation regions 144 as shown in FIG. 9F.

Figure 10A:
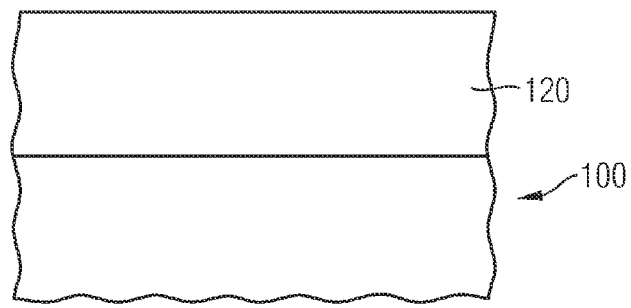
FIGS. 10A to 10C are cross-sectional views illustrating a method of manufacturing a semiconductor diode in accordance with yet another embodiment.
Figure 10B:
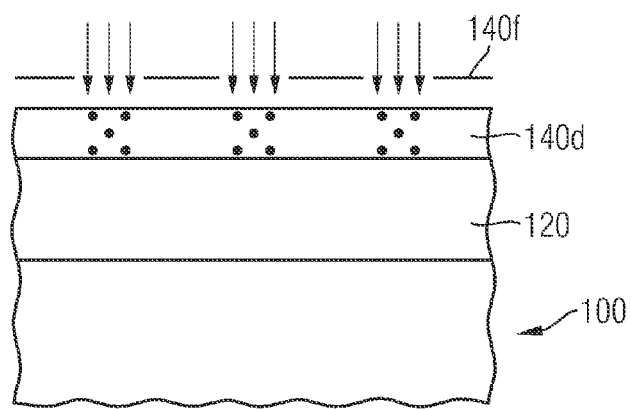
Figure 10C:
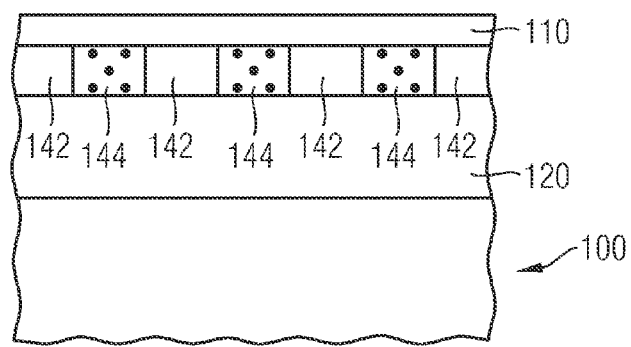

In FIGS. 10A to 10C, a method of manufacturing the semiconductor diode 500 according to a further embodiment will be described with reference to cross-sectional views for illustration of selected processes. In this process, forming the superjunction structure further comprises forming a semiconductor layer 140d on the drift region 120, and implanting at least one of n-type dopants and p-type dopants into the semiconductor layer 140d via a mask 140f.

As shown in FIGS. 10A and 10B, a semiconductor layer 140d is deposited by epitaxial growth on a drift region 120 within a semiconductor body 100 and thereafter dopant zones 140f are formed by means of a mask 140f in the semiconductor layer 140d, e.g. by ion implantation. The dopant zones 140e may be of a first conductivity type in case of forming the barrier regions 142 within the dopant zones 140e. The dopant zones 140e may also be of a second conductivity type in case of forming compensation regions 144 within the dopant zones 140e. As shown in FIG. 12B, only dopant zones of a first or second conductivity type are formed by masking after forming the epitaxial semiconductor layer 140d of a second or first opposite conductivity type, respectively. It is, however, also possible to form an intrinsic or lightly doped epitaxial layer and to introduce dopant zones of the first and second conductivity type by masking to form the barrier and compensation regions 142, 144 within the barrier layer 140a, respectively. As shown in FIG. 10C, a first electrode region 110 is formed on the injection efficiency control region 140 after an activation step to form the barrier regions 142 and the compensation regions 144.

In FIGS. 11A to 11E, a method of manufacturing the semiconductor diode 500 according to yet another embodiment will be described with reference to cross-sectional views for illustration of selected processes.

Figure 11A:
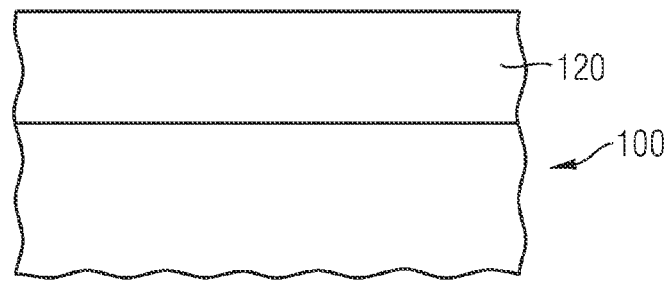
FIGS. 11A to 11E are cross-sectional views illustrating a method of manufacturing a semiconductor diode in accordance with a further embodiment.
Figure 11B:
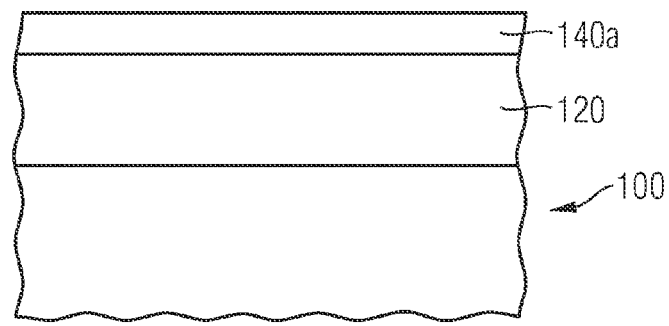
Figure 11C:
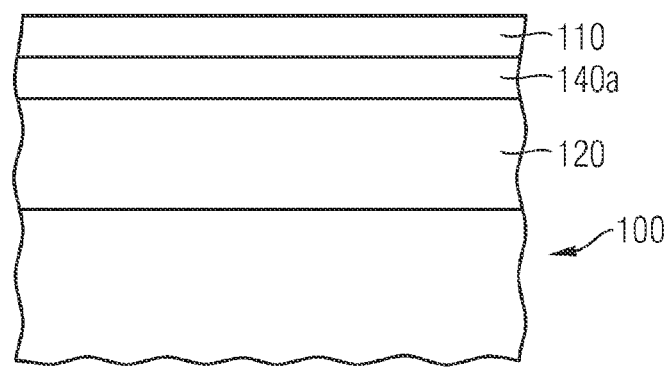

As can be seen in FIGS. 11A to 11C, a barrier layer 140a of the first conductivity type is formed on a drift region 120 within a semiconductor body 100, e.g. by epitaxial growth or deposition or by ion implantation or in-diffusion of dopants. The barrier layer 140a may also be formed by introducing dopants of the first conductivity type into the drift zone 120 such that a net dopant concentration of the barrier layer 140a averaged along a vertical extension of the barrier layer 140a is at least three times greater than a net dopant concentration of the drift region averaged along 20% of a vertical extension of the drift zone 120 adjoining the barrier layer 140a. A first electrode region 110 of a second conductivity type is formed within the semiconductor body 100 directly adjoining the barrier layer 140a by, e.g. epitaxial growth or deposition. The first electrode region 110 may also be formed within the semiconductor body 100 by introducing dopants of the second conductivity type into the semiconductor body 100.

Figure 11D:
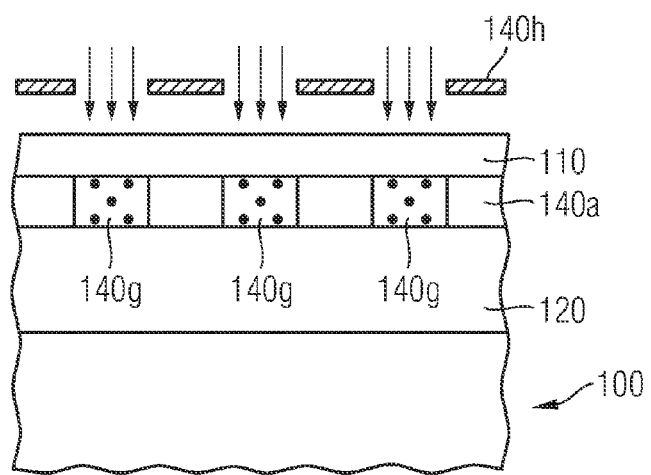
Figure 11E:
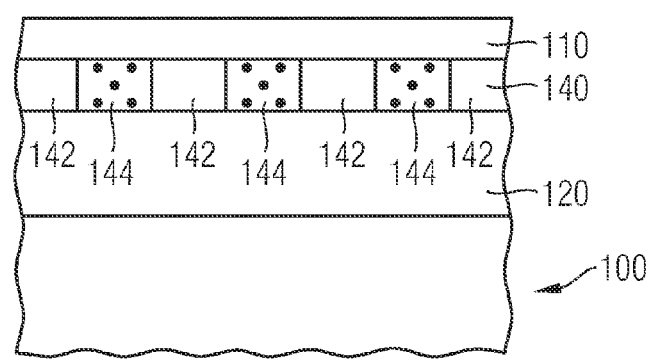

As shown in FIG. 11D, a deep implantation process is performed to introduce dopants through the first electrode region 110 into the barrier layer 140a, thereby forming dopant zones 140g. After an activation step, the barrier regions 142 and the compensation regions 144 are formed within the barrier layer 140a to form the injection efficiency control region 140 being sandwiched between the first electrode region 110 and the drift region 120 as shown in FIG. 11E. Although the deep implantation of dopants of the second conductivity type into the barrier layer 140a is shown to form the compensation regions 144, it is also possible to implant dopants of the first conductivity type in the barrier layer 140a to form barrier regions 142, wherein the barrier layer 140a is of a conductivity type, which is opposite to the conductivity type of the implanted dopants. The energy of deep implantation step performed with a mask 140h may be in the range of 1 to 3 MeV, for example.

The semiconductor diode according to an embodiment enables an enhancement of the dopant concentration and/or injection depth of the emitter region without having an excessive increase of cut-off power loss, since the barrier regions 142 within the injection efficiency control region 140 locally decrease the emitter injection efficiency. Thus, the peak current resistivity and robustness against cosmic radiation is enhanced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor diode, comprising:
   a semiconductor body comprising an injection efficiency control region between a drift region of a first conductivity type and a first electrode region of a second, opposite conductivity type, the injection efficiency control region comprising:
      a superjunction structure comprising a barrier region of the first conductivity type and a compensation region of the second conductivity type arranged consecutively along a lateral direction and directly adjoining each other,
   wherein a net dopant concentration of the barrier region averaged along a vertical extension of the barrier region is at least three times greater than a net dopant concentration of the drift region averaged along 20% of a vertical extension of the drift zone adjoining the barrier region.

2. The semiconductor diode of claim 1, wherein a bottom side of the barrier region and the compensation region is at a same vertical level.

3. The semiconductor diode of claim 1, wherein a distance between a bottom side of the barrier region and the first electrode region is smaller than 80% of a distance between a bottom side of the compensation region and the first electrode region.

4. The semiconductor diode of claim 1, wherein the barrier region and the compensation region each have a same width along a lateral direction.

5. The semiconductor diode of claim 1, wherein a ratio of widths between the barrier region and the compensation region along the lateral direction is greater than 2.

6. The semiconductor diode of claim 1, wherein a ratio of widths between the compensation region and the barrier region along the lateral direction is greater than 2.

7. The semiconductor diode of claim 1, wherein the superjunction structure laterally overlaps a boundary between an active region comprising the first electrode region and an edge termination structure.

8. The semiconductor diode of claim 1, wherein the first electrode region is an anode region.

9. The semiconductor diode of claim 1, wherein the net dopant concentration of the compensation region is greater than $1\times10^{16}$ cm$^{-3}$.

10. The semiconductor diode of claim 1, wherein the net dopant concentration of the barrier region is greater than $1\times10^{16}$ cm$^3$.

11. The semiconductor diode of claim 1, wherein a net amount of dopants in the barrier region and a net amount of dopants in the compensation region differ by less than 10%.

12. The semiconductor diode of claim 11, wherein the barrier region and the compensation region have different lateral widths.

13. The semiconductor diode of claim 1, wherein a net dopant concentration of the first electrode region comprises a lateral variation, and a net dopant concentration of a first zone of the first electrode region directly adjoining the barrier region is lower than a net dopant concentration of a second zone of the first electrode region directly adjoining the compensation region.

14. The semiconductor diode of claim 1, wherein a net dopant concentration of the first electrode region comprises a lateral variation, and a net dopant concentration of a first zone of the first electrode region directly adjoining the barrier region is greater than a net dopant concentration of a second zone of the first electrode region directly adjoining the compensation region.

15. The semiconductor diode of claim 1, wherein a net dopant concentration comprises a vertical variation, and the net dopant concentration of a first zone of the compensation region adjoining the drift region is greater than a net dopant concentration of a second zone of the compensation region adjoining the first electrode region.

16. The semiconductor diode of claim 1, wherein a width of a first zone of the compensation region adjoining the drift region is greater than a width of a second zone of the compensation region adjoining the first electrode region.

17. A method of manufacturing a semiconductor diode in a semiconductor body comprising a drift region of a first conductivity type, the method comprising:
   forming a first electrode region of a second, opposite conductivity type in the semiconductor body at a first surface of the semiconductor body; and
   forming a superjunction structure between the drift region and the first electrode region, the superjunction structure comprising a barrier region of the first conductivity type and a compensation region of the second conductivity type arranged consecutively along a lateral direction and directly adjoining each other,
   wherein a net dopant concentration of the barrier region averaged along a vertical extension of the barrier region is at least three times greater than a net dopant concentration of the drift region averaged along 20% of a vertical extension of the drift zone adjoining the barrier region.

18. The method of claim 17, wherein forming the barrier region comprises introducing dopants of the first conductivity type through the first surface into the semiconductor body, wherein a diffusion constant of the dopants is greater than a diffusion constant of other dopants of the first electrode region.

19. The method of claim 17, wherein forming the superjunction structure further comprises:
   forming a trench in the semiconductor body at the first surface; and
   introducing dopants through a sidewall of the trench into the semiconductor body.

20. The method of claim 19, wherein the dopants are introduced by at least one process of plasma deposition, tilted ion implantation, and diffusion.

21. The method of claim 19, wherein forming the superjunction structure further comprises:
   forming a semiconductor layer on the drift region; and implanting at least one of n-type dopants and p-type dopants into the semiconductor layer via a mask.

22. The method of claim 17, wherein forming the super-junction structure further comprises implanting at least one of n-type dopants and p-type dopants at implantation energies in a range of 1 MeV and 3 MeV.

* * * * *